United States Patent
Yong

(10) Patent No.: US 7,575,995 B2
(45) Date of Patent: Aug. 18, 2009

(54) METHOD OF FORMING FINE METAL PATTERN AND METHOD OF FORMING METAL LINE USING THE SAME

(75) Inventor: Kim Ki Yong, Euchun (KR)

(73) Assignee: Dongbu Electronics Co., Ltd., Seoul (KR)

( * ) Notice: Subject to any disclaimer, the term of this patent is extended or adjusted under 35 U.S.C. 154(b) by 291 days.

(21) Appl. No.: 11/319,532

(22) Filed: Dec. 29, 2005

(65) Prior Publication Data

US 2006/0141670 A1  Jun. 29, 2006

(30) Foreign Application Priority Data

Dec. 29, 2004  (KR)  ............... 10-2004-0114637

(51) Int. Cl.
*H01L 21/4763* (2006.01)

(52) U.S. Cl. .................. 438/618; 438/622; 438/631; 438/639; 438/698; 438/759; 257/E21.244; 257/E21.444; 257/E21.576; 257/E21.579; 257/E21.637; 257/E23.144; 257/E23.154; 257/E29.158; 257/E29.162; 257/E29.165

(58) Field of Classification Search .......... 438/629, 438/637, 640, 480, 311, 184, 639, 649–650, 438/618, 622, 631, 698.759; 257/E29.131, 257/E29.626, E29.64, E21.02, E29.132, E21.243, 257/E21.249, E21.038, 39, 202, 204, 244, 257/444, 576, 579, 589, 594, 637, 639, E23.144, 257/154, 156, E29.158, 162, 165

See application file for complete search history.

(56) References Cited

U.S. PATENT DOCUMENTS

| | | | | | |
|---|---|---|---|---|---|
| 4,645,562 | A * | 2/1987 | Liao et al. | .................... | 438/640 |
| 5,183,800 | A * | 2/1993 | Nakagawa | .................. | 505/330 |
| 5,643,837 | A * | 7/1997 | Hayashi | ...................... | 438/693 |
| 6,635,528 | B2 * | 10/2003 | Gilbert et al. | ............... | 438/253 |
| 7,132,364 | B2 * | 11/2006 | Kim | .......................... | 438/639 |
| 7,160,767 | B2 * | 1/2007 | Brask et al. | .................. | 438/195 |
| 7,473,632 | B2 * | 1/2009 | Ueda | .......................... | 438/622 |
| 2003/0017692 | A1 * | 1/2003 | Noguchi et al. | ............. | 438/622 |

FOREIGN PATENT DOCUMENTS

KR  100140485 B1  3/1998

OTHER PUBLICATIONS

Office Action from the Korean Intellectual Property Office, dated May 12, 2006, in related Korean Patent Application No. 10-2004-0114637.

* cited by examiner

*Primary Examiner*—Michael S Lebentritt
(74) *Attorney, Agent, or Firm*—Finnegan, Henderson, Farabow, Garrett & Dunner, L.L.P.

(57) ABSTRACT

There are provided a method of forming a fine metal pattern and a method of forming a metal line using the same. In the method of forming a fine metal pattern, a substrate is prepared where a first interlayer insulating layer is formed. A via plug is formed on the first interlayer insulating layer. A plurality of sidewall buffer patterns are formed on the first interlayer insulating layer having the via plug, wherein the plurality of the sidewall buffer patterns are spaced apart from each other by a predetermined distance. The sidewall layer is deposited on the first interlayer insulating layer and the sidewall buffer patterns. The sidewall layer is etched such that sidewall patterns remains on sidewalls of the sidewall buffer patterns.

20 Claims, 4 Drawing Sheets

METHOD OF FORMING FINE METAL PATTERN AND METHOD OF FORMING METAL LINE USING THE SAME

BACKGROUND OF THE INVENTION

1. Field of the Invention

The present invention relates to a semiconductor device, and more particularly, to a method of forming a fine metal pattern and a method of forming a metal line using the same.

2. Description of the Related Art

FIG. 1 is a cross-sectional view illustrating a related art method of forming a metal line in a semiconductor device.

Referring to FIG. 1, to begin with, a first interlayer insulating layer 20 is deposited on a substrate 10, and the first interlayer insulating layer 20 is patterned and etched to form a via hole (not shown).

Thereafter, tungsten is filled into the via hole so as to form a via plug 30.

Afterwards, a metal layer (not shown) is deposited on the first interlayer insulating layer 20 as well as the via plug 30. Thereafter, a photoresist layer (not shown) is deposited on the metal layer, and it is patterned into a predetermined configuration.

Subsequently, the metal layer is etched using the patterned photoresist layer as an etch mask to thereby form a metal line 70.

After forming the metal line 70, a second interlayer insulating layer 60 is deposited on the metal line 70 as well as the first interlayer insulating layer 20, and it is planarized so as to complete a semiconductor device having the metal line 70 therein.

Meanwhile, as the semiconductor device is highly integrated and micronized recently, the critical dimension (CD) of the metal line is reduced proportionally. In particular, the performance of the semiconductor device depends on whether or not the critical dimension of the metal line in nano-scale feature may be implemented in high technology semiconductors.

However, a variable to determine the critical dimension of the metal line in the related art mainly depends on the performance of a photolithographic apparatus.

Therefore, there is such a serious problem in the related art that the critical dimension of the metal line only depends on the performance of the photolithographic apparatus utterly.

In addition, if the second interlayer insulating layer is deposited after forming the metal line according to the related art, there is another drawback that there occurs a void in the second interlayer insulating layer.

SUMMARY OF THE INVENTION

Accordingly, the present invention is directed to a method of forming a fine metal pattern and a method of forming a metal line using the same that substantially obviates one or more problems due to limitations and disadvantages of the related art.

An object of the present invention is to provide a method of forming a metal pattern capable of obtaining a fine metal pattern in spite of using an existing photolithographic apparatus.

Another object of the present invention is to provide a method of forming a metal line using the method of forming the fine metal pattern where a void dose not occur in a second interlayer insulating layer, capable of obtaining a fine metal line in spite of using the existing photolithographic apparatus.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a method of forming a fine metal pattern, the method including: preparing a substrate where a first interlayer insulating layer is formed; forming a via plug on the first interlayer insulating layer; forming a plurality of sidewall buffer patterns on the first interlayer insulating layer having the via plug, wherein the plurality of the sidewall buffer patterns are spaced apart from each other by a predetermined distance; depositing the sidewall layer on the first interlayer insulating layer and the sidewall buffer patterns; and etching the sidewall layer such that sidewall patterns remains on sidewalls of the sidewall buffer patterns.

In another aspect of the present invention, there is provided a method of forming a metal line using the method of forming the fine metal pattern, the method including: preparing a substrate where a first interlayer insulating layer is formed; forming a via plug on the first interlayer insulating layer; forming a plurality of sidewall buffer patterns on the first interlayer insulating layer having the via plug, wherein the plurality of the sidewall buffer patterns are spaced apart from each other by a predetermined distance; depositing the sidewall layer on the first interlayer insulating layer and the sidewall buffer patterns; etching the sidewall layer such that sidewall patterns remains on sidewalls of the sidewall buffer patterns; depositing a metal layer on the sidewall buffer pattern, the sidewall pattern, and the via plug as well as the first interlayer insulating layer; and forming a metal line by planarizing the metal layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are

First Embodiment

FIGS. 2A to 2D are cross-sectional views illustrating a method of forming a fine metal pattern according to a first embodiment of the present invention.

The method of forming the fine metal pattern according to the first embodiment of the present invention includes: preparing a substrate; forming a via plug; forming a sidewall buffer pattern; depositing a sidewall layer; and etching the sidewall layer. At this time, the above respective operations and other operations which may be added to these operations, may be performed in alternate sequences thereof.

Figure 2A:
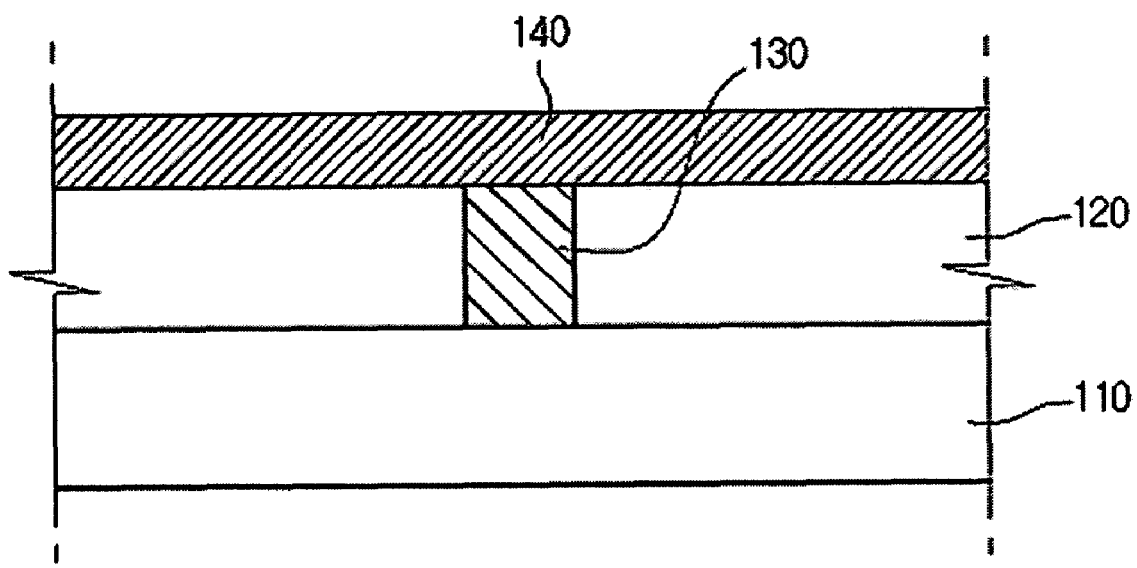
FIGS. 2A to 2D are cross-sectional views illustrating a method of forming a fine metal pattern according to a first embodiment of the present invention.

To being with, referring to FIG. 2A, the substrate 110 is prepared where a first interlayer insulating layer 120 is formed. The first interlayer insulating layer 120 may be formed of chemical vapor deposition (CVD)-tetraethyl orthosilicate (TEOS), plasma enhanced CVD-$SiO_2$, PECVD-SiON, borophospho silicate glass (BPSG) using TEOS, or another interlayer dielectric material.

Thereafter, a via hole (not shown) is formed in the first interlayer insulating layer 120. Then, the via hole is filled with a predetermined material to thereby form a via plug 130.

Herein, the via plug 130 may be formed of tungsten, aluminum, copper, or another metal. Since the tungsten is a refractory metal, it has several advantages that it is possible to inhibit the electro migration and it is applicable to the high temperature process. The aluminum has advantageous merits that its resistivity is low, and it can be deposited at a low temperature, e.g., about 250° C., and further its step coverage is very excellent.

Afterwards, referring to FIG. 2A, a sidewall buffer layer 140 is formed on the via plug 130 as well as the first interlayer insulating layer 120. At this time, the sidewall buffer layer 140 may be formed of oxide or nitride. Moreover, the sidewall buffer layer 140 may be formed of another material which is more excellent in etch selectivity than the first interlayer insulating layer 120.

Figure 2B:
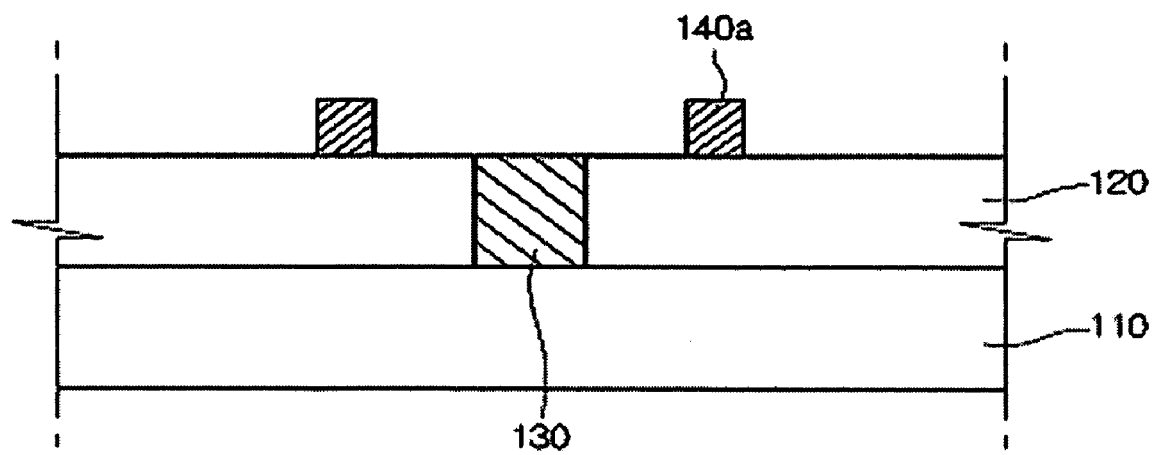

Subsequently, referring to FIG. 2B, a photoresist layer (not shown) is formed on the sidewall buffer layer 140 and it is patterned into a predetermined configuration. Thereafter, the sidewall buffer layer 140 is etched using the patterned photoresist layer as an etch mask to form a plurality of sidewall buffer patterns 140a which are spaced apart from each other by a predetermined distance. At this time, a metal line pattern is basically determined by the predetermined distance between the sidewall buffer patterns 140a.

Figure 2C:
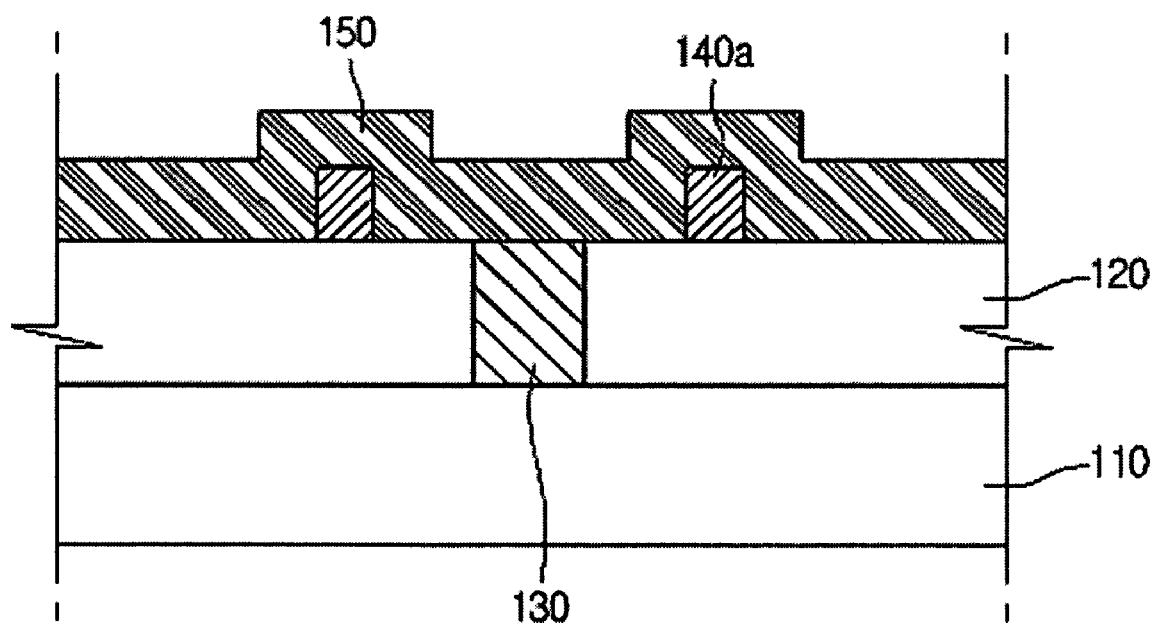

Next, referring to FIG. 2C, a sidewall layer 150 is deposited on the sidewall buffer patterns 140a as well as the first interlayer insulating layer 120. At this time, the sidewall layer 150 may be formed of oxide or nitride. Moreover, the sidewall layer 150 may be formed of another material which is more excellent in etch selectivity than the first interlayer insulating layer 120.

In addition, the first embodiment of the present invention may be further include an operation of planarizing the sidewall layer 150 after depositing the sidewall layer 150.

Figure 2D:
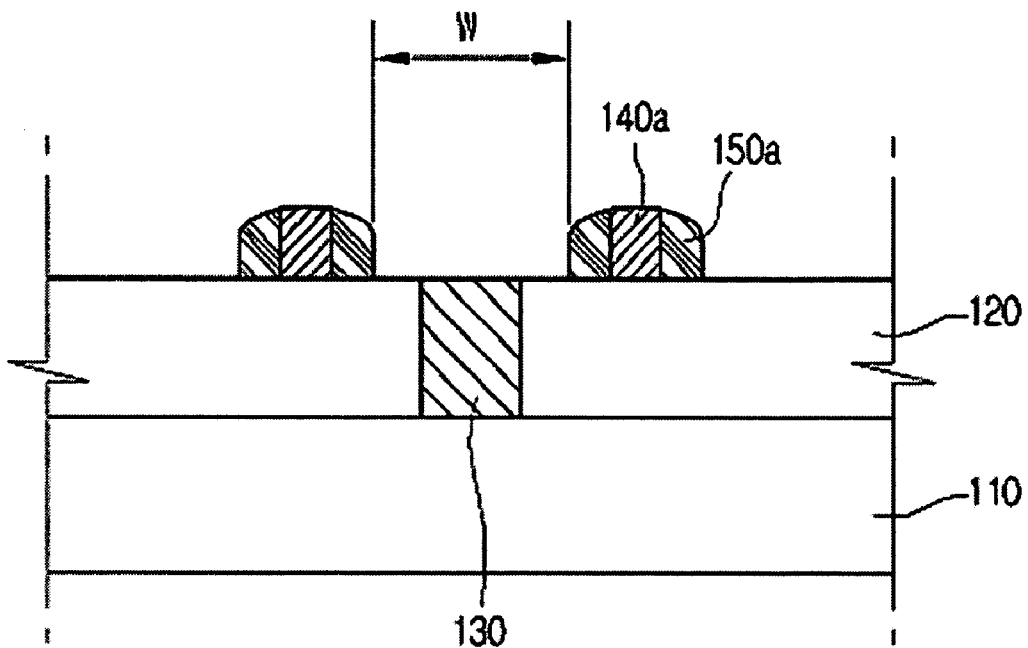

Thereafter, referring to FIG. 2D, the sidewall layer 150 is etched such that sidewall patterns 150a remain on sidewalls of the sidewall buffer patterns 140a.

At this time, the sidewall layer 150 is etched such that the distance W between the sidewall patterns 150a remaining on the sidewalls of the sidewall buffer patterns 140a maintains the critical dimension (CD) of the metal pattern.

In particular, since the width of the sidewall pattern 150a is determined according to the height of the sidewall buffer pattern 140a in the first embodiment of the present invention, the critical dimension may be controlled by the distance W between the sidewall patterns 150a.

For example, as the sidewall buffer pattern 140a becomes higher and higher, the sidewall pattern 150a formed on the sidewall of the sidewall buffer pattern 140a is wider and wider. As a result, the distance W between the sidewall patterns 150a becomes narrow so that it is possible to obtain the critical dimension of the fine metal pattern. This is because the sidewall pattern 150a is wider and wider as the sidewall buffer pattern 140a is higher and higher, and vice versa, as the sidewall buffer pattern 140a is lower and lower, the sidewall pattern 150a formed on the sidewalls of the sidewall buffer pattern 140a becomes narrower and narrower.

That is, in the first embodiment of the present invention, the critical dimension of the metal pattern may be controlled by the width of the sidewall pattern 150a which are determined according to the distance between the sidewall buffer patterns 140a and the height of the sidewall buffer pattern 140a.

According to the first embodiment of the present invention, the inventive method is effective for obtaining the metal pattern with the fine critical dimension, which cannot be achieved by the existing photolithographic apparatus according to the related art, by controlling the distance between the sidewall buffer patterns and the height of the sidewall buffer pattern, in spite of using the existing photolithographic apparatus.

Second Embodiment

Figure 3A:
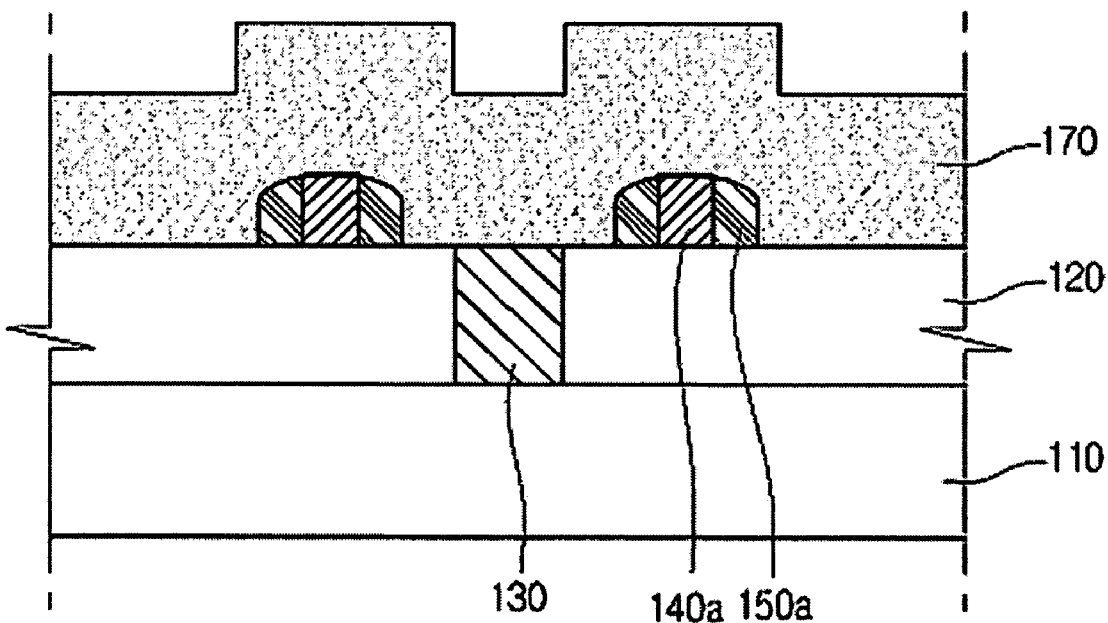
FIGS. 3A and 3B are cross-sectional views illustrating a method of forming a metal line using the method of forming the fine metal pattern according to a second embodiment of the present invention.
Figure 3B:
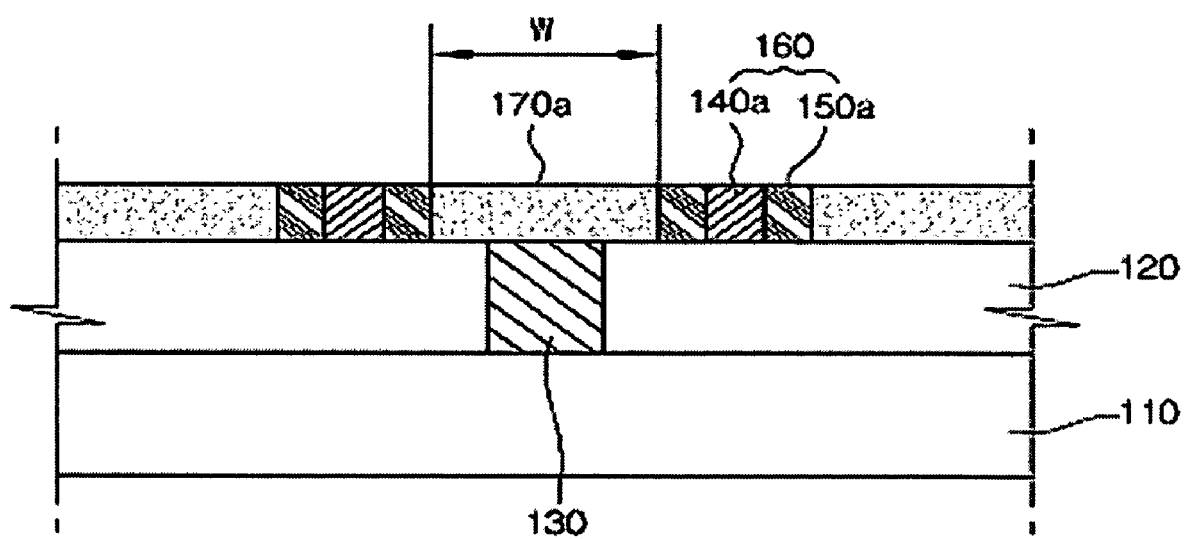

FIGS. 3A and 3B are cross-sectional views illustrating a method of forming a metal line using the method of forming the fine metal pattern according to a second embodiment of the present invention.

The method of forming the metal line using the method of forming the fine metal pattern according to the second embodiment of the present invention includes: preparing a substrate; forming a via plug; forming a sidewall buffer pattern; depositing a sidewall layer; etching the sidewall layer; depositing a metal layer; and forming a metal line. At this time, the above respective operations and other operations which may be added to these operations, may be performed in alternate sequences thereof.

To begin with, the operation of preparing the substrate, the operation for forming the via plug, the operation of forming the sidewall pattern, the operation for depositing the sidewall layer, and the operation of etching the sidewall layer may be performed by employing the method of the first embodiment.

For example, the sidewall layer 150 is etched such that the distance W between sidewall patterns 150a remaining on the sidewalls of the sidewall buffer patterns 140a maintains the critical dimension (CD) of the metal line.

Thereafter, referring to FIG. 3A, a metal layer 170 is deposited on the sidewall buffer pattern 140a, the sidewall pattern 150a, and the via plug 130 as well as the first interlayer insulating layer 120.

The metal layer 170 may be formed of aluminum, copper, or another metal. The aluminum has merits that its resistivity is low and has good adhesive force with respect to silicon oxide ($SiO_2$) or silicon. The copper has advantages that its resistivity is lower than that of the aluminum and has good property to prevent the electro migration. Furthermore, if the metal layer 170 is used by adding small amount of copper, titanium, silicon or the like into aluminum, it shows an advantageous merit that it is possible to remove the phenomenon of the aluminum electro migration.

Afterwards, referring to FIG. 3B, the metal layer 170 is planarized to form a metal line 170a. The planarization may be performed using CMP process or the like. Accordingly, the semiconductor device with the fine metal line is completed in which the distance W between the sidewall patterns 150a is correspondent to the critical dimension of the metal line.

Figure 1:
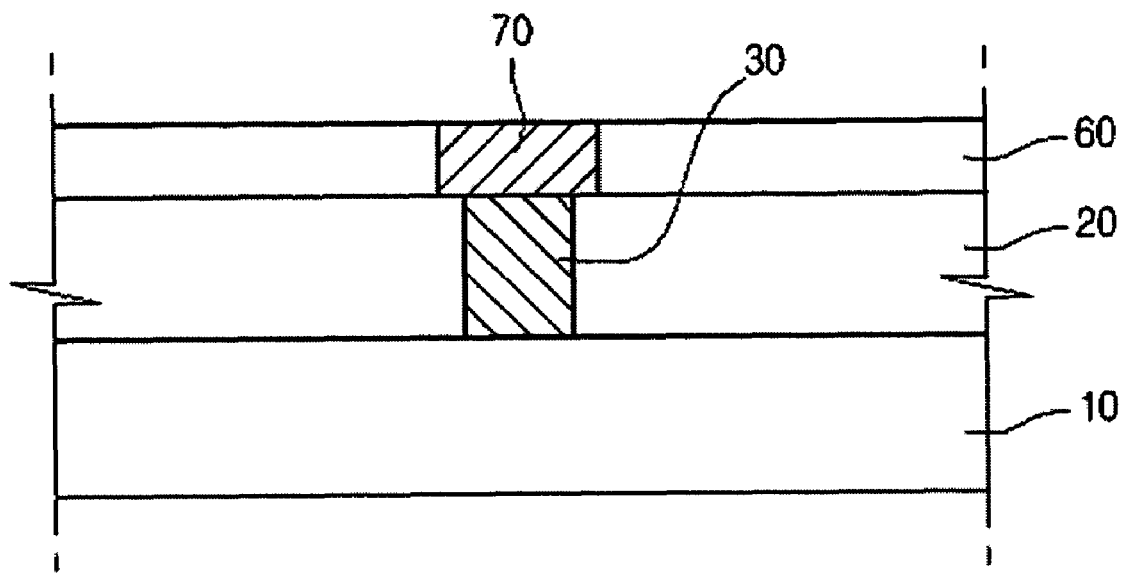
FIG. 1 is a cross-sectional view illustrating a related art method of forming a metal line.

In addition, according to the second embodiment of the present invention, the sidewall buffer pattern 140a and the sidewall pattern 150a which are disposed between the metal lines 170a act as a second interlayer insulating layer, which is denoted as the reference numeral 160 in FIG. 1. Therefore, it is possible to omit the additional operation of forming the second interlayer insulating layer in comparison with the related art.

In particular, according to the second embodiment of the present invention, the width of the sidewall pattern 150a is determined according to the height of the sidewall buffer pattern 140a so that the critical dimension of the metal line may be controlled by the distance W between the sidewall patterns 150a.

For instance, as the sidewall buffer pattern 140a becomes high, the sidewall pattern 150a becomes wide correspondingly. Therefore, the distance W between the sidewall patterns 150a become narrow as the sidewall pattern 150a becomes wide so that it is possible to obtain the metal line 170a with the fine critical dimension. Namely, this is because the width of the sidewall pattern 150a becomes larger and larger as the sidewall buffer pattern 140a is higher and higher, and vice versa, as the height of sidewall buffer layer 140 is smaller and smaller, the sidewall pattern 150a formed on the sidewalls of the sidewall buffer pattern 140a becomes narrower and narrower.

That is, in the second embodiment of the present invention, the critical dimension of the metal line may be controlled by the width of the sidewall pattern 150a which is determined according to the distance between the sidewall buffer patterns 140a and the height of the sidewall buffer pattern 140a.

According to the method of forming the metal line using the method of forming the fine metal pattern according to the second embodiment of the present invention, it is possible to obtain the metal pattern with the fine critical dimension, which cannot be achieved by the existing photolithographic apparatus according to the related art. Accordingly, the inventive method is effective for improving the performance of the semiconductor device by forming the metal line having the fine critical dimension in spite of using the existing photolithographic apparatus.

In addition, according to the second embodiment of the present invention, the sidewall buffer layer 140 and the sidewall layer 150 may act as the second interlayer insulating layer 160 so that it is possible to omit the additional operation for forming the second interlayer insulating layer. Therefore, it is helpful for economy of the semiconductor process. In particular, it is effective for preventing the void which may occur due to a gap-fill property of the second interlayer insulating layer.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of forming a fine metal pattern, the method comprising:
    preparing a substrate where a first interlayer insulating layer is formed;
    forming a via plug in the first interlayer insulating layer;
    forming a plurality of sidewall buffer patterns on the first interlayer insulating layer having the via plug, wherein the plurality of the sidewall buffer patterns are spaced apart from each other by a predetermined distance and wherein the sidewall buffer patterns are formed above the via plug;
    depositing a sidewall layer on the first interlayer insulating layer and the sidewall buffer patterns, wherein the sidewall layer contacts the via plug; and
    etching the sidewall layer such that a portion of the sidewall layer remains on sidewalls of the sidewall buffer patterns.

2. The method according to claim 1, wherein the forming a plurality of sidewall buffer patterns includes:
    depositing the sidewall buffer layer on the substrate having the via plug;
    coating a photoresist layer on the sidewall buffer layer and patterning the photoresist layer; and
    etching the sidewall buffer layer using the patterned photoresist layer as an etch mask.

3. The method according to claim 1, further comprising, after the depositing the sidewall layer, planarizing the sidewall layer.

4. The method according to claim 1, wherein, in the etching the sidewall layer, the sidewall layer is etched such that the distance between the sidewall patterns remaining on the sidewalls of the sidewall buffer patterns maintains a critical dimension (CD) of a metal pattern.

5. The method according to claim 1, wherein, in the etching the sidewall layer, the critical dimension of the metal pattern is controlled by the distance between the sidewall patterns as the width of the sidewall pattern is determined in accordance with the height of the sidewall buffer pattern.

6. The method according to claim 1, wherein, in the etching the sidewall layer, the distance between the sidewall patterns is shortened to be a critical dimension of a fine metal pattern as the sidewall pattern becomes wide with the increase of the height of the sidewall buffer pattern.

7. The method according to claim 1, wherein the sidewall buffer pattern is formed of a material which is better in etch selectivity than the interlayer insulating layer.

8. The method according to claim 1, wherein the sidewall buffer pattern is formed of one of oxide and nitride.

9. The method according to claim 1, wherein the sidewall layer is formed of a material which is better in etch selectivity than the interlayer insulating layer.

10. The method according to claim 1, wherein the sidewall layer is formed of one of oxide and nitride.

11. A method of forming a metal line, the method comprising:
    preparing a substrate where a first interlayer insulating layer is formed;
    forming a via plug in the first interlayer insulating layer;
    forming a plurality of sidewall buffer patterns on the first interlayer insulating layer having the via plug, wherein the plurality of the sidewall buffer patterns are spaced apart from each other by a predetermined distance and wherein the sidewall buffer patterns are formed above the via plug;

depositing a sidewall layer on the first interlayer insulating layer and the sidewall buffer patterns, wherein the sidewall layer contacts the via plug;

etching the sidewall layer such that a portion of the sidewall layer remains on sidewalls of the sidewall buffer patterns;

depositing a metal layer on the sidewall buffer pattern, the sidewall pattern, and the via plug as well as the first interlayer insulating layer, wherein depositing the metal layer is performed after etching the sidewall layer; and forming a metal line by planarizing the metal layer.

12. The method according to claim 11, wherein the forming a plurality of sidewall buffer patterns includes:

depositing the sidewall buffer layer on the substrate having the via plug;

coating a photoresist layer on the sidewall buffer layer and patterning the photoresist layer; and etching the sidewall buffer layer using the patterned photoresist layer as an etch mask.

13. The method according to claim 11, further comprising, after the depositing the sidewall layer, planarizing the sidewall layer.

14. The method according to claim 11, wherein, in the etching the sidewall layer, the sidewall layer is etched such that the distance between the sidewall patterns remaining on the sidewalls of the sidewall buffer patterns maintains a critical dimension (CD) of a metal line.

15. The method according to claim 11, wherein, in the etching the sidewall layer, the critical dimension of the metal line is controlled by the distance between the sidewall patterns as the width of the sidewall pattern is determined in accordance with the height of the sidewall buffer pattern.

16. The method according to claim 11, wherein, in the etching the sidewall layer, the distance between the sidewall patterns is shortened to be a critical dimension of a fine metal line as the sidewall pattern becomes wide with the increase of the height of the sidewall buffer pattern.

17. The method according to claim 11, wherein the sidewall buffer pattern is formed of a material which is better in etch selectivity than the interlayer insulating layer.

18. The method according to claim 11, wherein the sidewall buffer layer is formed of one of oxide and nitride.

19. The method according to claim 11, wherein the sidewall layer is formed of a material which is better in etch selectivity than the interlayer insulating layer.

20. The method according to claim 11, wherein the metal layer is formed of one of aluminum and copper.

* * * * *